US008721346B2

(12) United States Patent
Lin et al.

(10) Patent No.: US 8,721,346 B2
(45) Date of Patent: May 13, 2014

(54) SIGNAL TRANSMISSION MODULE

(75) Inventors: Yu-Fang Lin, New Taipei (TW);
Hsien-Ming Lee, New Taipei (TW);
Hao-Chung Lien, New Taipei (TW)

(73) Assignee: Ability Enterprise Co., Ltd., Taipei (TW)

( * ) Notice: Subject to any disclaimer, the term of this patent is extended or adjusted under 35 U.S.C. 154(b) by 112 days.

(21) Appl. No.: 13/176,680

(22) Filed: Jul. 5, 2011

(65) Prior Publication Data

US 2012/0149220 A1 Jun. 14, 2012

(30) Foreign Application Priority Data

Dec. 13, 2010 (TW) .............................. 99143584 A

(51) Int. Cl.
*H01R 39/00* (2006.01)
(52) U.S. Cl.
USPC ............. 439/10; 439/164; 439/376; 439/172; 439/946
(58) Field of Classification Search
USPC .................... 439/10, 131, 164, 172, 376, 946
See application file for complete search history.

(56) References Cited

U.S. PATENT DOCUMENTS

| 6,394,813 | B1* | 5/2002 | Stout et al. ................... 439/11 |
| 6,731,194 | B1* | 5/2004 | Abe ............................. 338/167 |
| 6,786,743 | B2* | 9/2004 | Huang ......................... 439/131 |
| 7,009,847 | B1* | 3/2006 | Wu et al. ...................... 361/737 |
| 7,165,739 | B2* | 1/2007 | Wei ............................. 242/378.1 |
| 8,142,210 | B2* | 3/2012 | Gao et al. .................... 439/131 |
| 8,241,048 | B2* | 8/2012 | Hsiao ........................... 439/135 |
| 8,272,884 | B2* | 9/2012 | Lin et al. ...................... 439/131 |
| 8,305,288 | B2* | 11/2012 | Chen ............................ 343/882 |
| 8,308,494 | B1* | 11/2012 | Zhao ............................ 439/131 |
| 8,333,615 | B2* | 12/2012 | Zhao et al. ................... 439/660 |
| 2004/0159734 | A1 | 8/2004 | Wei |
| 2005/0006517 | A1* | 1/2005 | Wei ............................. 242/378.1 |
| 2005/0161513 | A1* | 7/2005 | Huang et al. ................. 235/492 |
| 2011/0076873 | A1* | 3/2011 | Fonzo .......................... 439/485 |
| 2011/0104954 | A1* | 5/2011 | Zhao et al. ................... 439/660 |
| 2012/0149219 | A1* | 6/2012 | Lin et al. ...................... 439/131 |
| 2012/0149220 | A1* | 6/2012 | Lin et al. ...................... 439/131 |
| 2012/0156908 | A1* | 6/2012 | Hsiao ........................... 439/131 |
| 2013/0122726 | A1* | 5/2013 | Row ............................. 439/131 |

FOREIGN PATENT DOCUMENTS

| TW | 582658 U | 4/2004 |
| TW | M265668 | 5/2005 |
| TW | M341970 | 10/2008 |

* cited by examiner

*Primary Examiner* — James Harvey
(74) *Attorney, Agent, or Firm* — Rabin & Berdo, P.C.

(57) ABSTRACT

A signal transmission module is provided. The signal transmission module includes an electrical connector, a linked unit, a data connector, a sliding block, a link and a lock block. The data connector rotates and expands according to a first shaft and a first elastomer of the linked unit, and electrically connects to the electrical connector. During retraction of the data connector, the data connector pushes the sliding block. Then the sliding block moves against the lock block so that the lock block rotates. The lock block rotates to lock and secure the data connector by the lock piece, while a cam of the link moves to a secure location along an incline plane of a track of the sliding block.

19 Claims, 9 Drawing Sheets

SIGNAL TRANSMISSION MODULE

CROSS-REFERENCE TO RELATED APPLICATIONS

The entire contents of Taiwan Patent Application No. 099143584, filed on Dec. 13, 2010, from which this application claims priority, are incorporated herein by reference.

BACKGROUND OF THE INVENTION

1. Field of the Invention

The present invention generally relates to a signal transmission module, and more particularly to a rotary type signal transmission module which is expanded and retracted through pressing.

2. Description of Related Art

Modern portable 3C electronic products such as digital cameras, digital video cameras, mobile phones, notebook personal computers and tablet personal computers etc. with advantages of light weight, small size, powerful functions and ease-of-carry are widely loved and used by consumers. Portable electronic products such as digital cameras and digital video cameras usually need an additional signal transmission line for connecting other electronic products or systems to transmit data such as photographs or video files or to recharge batteries.

The invention provides an extendable signal transmission module of a portable electronic product as an alternate choice to the conventional signal transmission line which can enable the user to perform file transfer and battery recharge tasks.

SUMMARY OF THE INVENTION

An object of the present invention is to provide a signal transmission module with a data connector which can be extended and retracted via pressing of the data connector. Since the data connector can be extended and retracted via pressing the data connector as a signal transmission interface between two electronic products and no separate switch structure is needed, additional space for extra switch structure can be saved and the exterior of the signal transmission module can be more concise.

The elastically extendable signal transmission module of the invention can be applied to any portable electronic appliance which needs a transmission line to connect another electronic system for data transmission or battery recharge. By way of an elastically extendable design the user can implement a direct-press to extend the data connector out, and to retract the data connector the user need only press the data connector again whereby the data connector can be retracted back into the signal transmission module.

According to the object set forth above, one embodiment of the present invention provides a signal transmission module comprising an electrical connector, a linked unit, a data connector, a sliding block, a link, and a lock block. The linked unit has a first shaft, a second shaft, a third shaft, a first elastomer and a second elastomer. The data connector rotates and expands according to the first shaft and the first elastomer and electrically connects to the electrical connector. The sliding block has a track with at least one incline plane and a secure location. The link includes a first end pivoting on the third shaft and a second end with a cam. The lock block with a lock piece pivots on the second shaft through the second elastomer. During the retraction of the data connector, the data connector pushes the sliding block to rotate the lock block so that the lock block locks and secure the data connector by the lock piece, the cam of the link moves to the secure location along the incline plane of the track.

BRIEF DESCRIPTION OF THE DRAWINGS

The accompanying drawings illustrate various embodiments of the present invention and are a part of the specification. The illustrated embodiments are merely examples of the present invention and do not limit the scope of the invention.

DETAILED DESCRIPTION OF THE INVENTION

The detailed description of the present invention will be discussed in the following embodiments in accordance with corresponding drawings which are not intended to limit the scope of the present invention, but can be adapted for other applications. Beside the detailed description, the invention can be made and performed by other replacement, modified and equivalent embodiments which are included in the scopes of the invention and the claims. In the description of the present invention, a plurality of detailed features are provided to enable one with ordinary skill in the art to make and use the invention. However, the invention can still be performed while some detailed features are omitted. Furthermore, well-known process steps or elements are not described in detail. While drawings are illustrated in detail, it is appreciated that the scale of each component may not be expressly exactly.

The signal transmission module according to the embodiments of the invention can be applied to connect, but not limited to, portable electronic products/appliances. The portable electronic appliance comprises, but not limited to, handheld PC, personal digital assistant (PDA), MPEG audio player 3(MP3), global positioning system (GPS), mobile communication devices, digital camera and digital video camera, any electronic appliance which applies data connectors is included in the scope of the invention.

Figure 1:
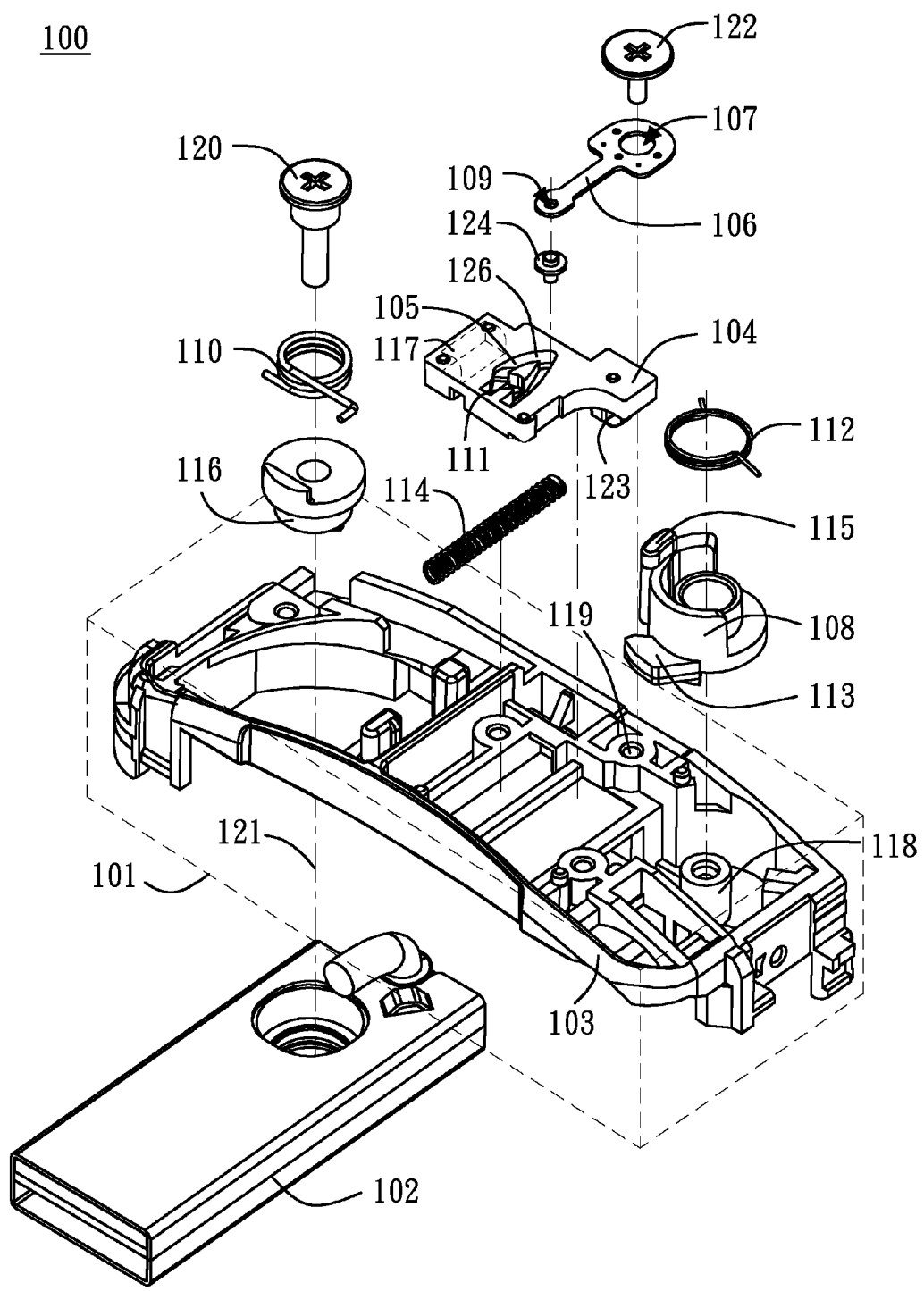
FIG. 1 shows a partial exploded view of a signal transmission module according to one embodiment of the invention.

Referring to FIG. 1, a partial exploded view of a signal transmission module according to one embodiment of the invention is shown. While FIG. 6 and FIG. 8 respectively show schematic views of data connectors of signal transmission modules after retracting back according to one embodiment of the invention.

Figure 6:
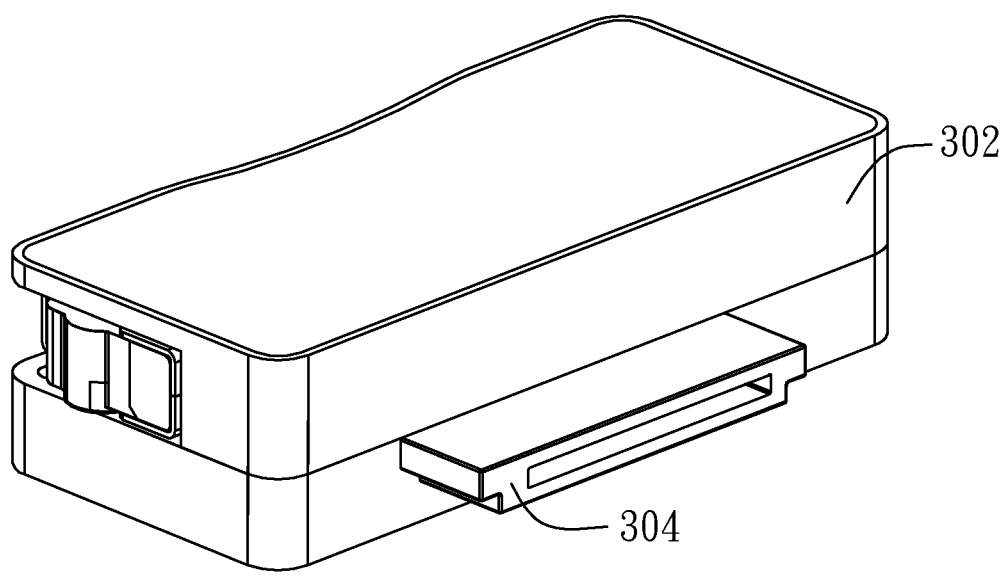
FIG. 6 and FIG. 7 respectively show schematic views of data connectors of signal transmission modules after retracting back and extending out according to one embodiment of the invention.
Figure 8:
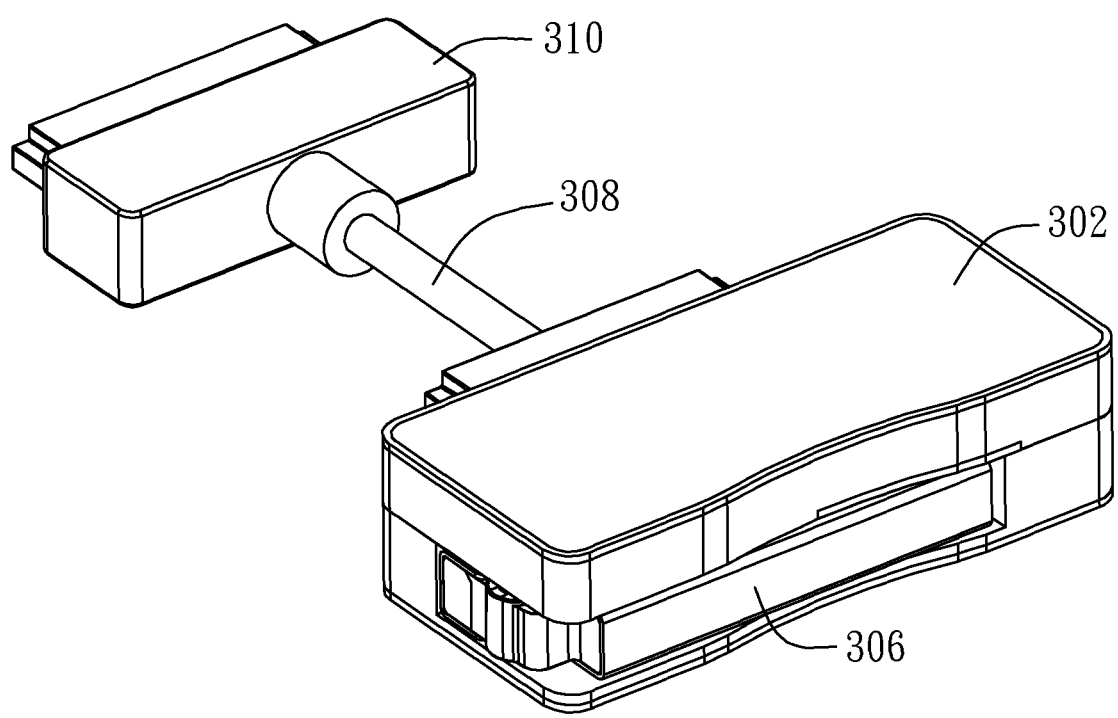
FIG. 8 and FIG. 9 respectively show schematic views of data connectors of signal transmission modules after retracting back and extending out according to another embodiment of the invention.

Referring to FIG. 1, FIG. 6, and FIG. 8, the signal transmission module 100 comprises a frame component 103, electrical connectors 304 and 310, a data connector 102, a sliding block 104, a link 106 and a lock block 108. The data connector 102, the sliding block 104, the link 106 and the lock block 108 are deposed on the frame component 103. The electrical connectors 304 and 310 can be deposed on a module frame 101 of the signal transmission module 100 and electrically connect to the data connector 102. The electrical connectors 304 and 310 can also be deposed outside the module frame 101 and electrically connect to the data connector 102 via a connecting line.

Referring to FIG. 1, the signal transmission module 100 further comprises elastomers 110, 112 and 114 and a shaft component 116. The data connector 102 includes, but not limited to, a Universal Serial Bus (USB) data connector or an IEEE 1394 data connector. The frame component 103 and the main frame 101 can be formed by injection molding. The frame component 103 and the main frame 101 can be formed separately and then be assembled. The data connector 102, the shaft component 116 and the elastomer 110 are assembled on the main frame 101 and pivot a rotation axis/shaft 121 of the main frame 101. The data connector 102, the shaft component 116 and the elastomer 110 are secured on the main frame 101 via a screw 120 so that the data connector 102 can rotate via the elastomer 110 according to the rotation axis/shaft 121 of the main frame 101.

The lock block 108 includes a lock piece 113 and a block piece 115. The lock block 108 and the elastomer 112 are assembled on frame component 103 and pivot a rotation axis/shaft 118 of the frame component 103. The lock block 108 rotates according to the rotation axis/shaft 118 of the frame component 103 to deform the elastomer 112. The deformation recovery force of the elastomer 112 can be used to force the lock block 108 back to the position before rotation. The elastomers 110 and 112 comprise torsion springs. The link 106 has a first end 107 and a second end 109. The first end 107 is assembled on the frame component 103 via a rotation axis/shaft 119 of the frame component 103 passing through the first end 107 and a screw 122 so that the link 106 can rotate according to the rotation axis/shaft 119 of the frame component 103. The second end 109 of the link 106 includes a cam 124. The sliding block 104 has a track 105 and a barricade 123. The track 115 includes at least one incline plane and a secure location 111. The cam 124 of the link 106 moves along the track 105 of the sliding block 104. Particularly, the track 105 includes a plurality of incline planes with different tilt angles and height levels and the secure location 111. The sliding block 104 is disposed on the frame component 103 and is movable thereon. Moreover, an elastomer 114 leaned against the sliding block 104 is used to render the sliding block 104 movable back and forth on the frame component 103. The elastomer 114 accumulates elastic potential energy during deformation and the elastic potential energy will be transferred to kinetic energy when the force applied upon the elastomer 114 is removed. The elastomer 114 is disposed in a slot 117 and the elastomer 114 in the slot 117 will be forced to be compressed to deform when the data connector 102 pushes the sliding block 104. The deformation recovery force of the elastomer 114 will pushed the sliding block 104 back to the original position when the data connector 102 rotates and expands. The elastomer 114 comprises a spring. The second end 109 of the link 106 contacts and moves upon the incline plane of the track 105. The shaft component 116 is disposed and pivots on the rotation axis/shaft 121. The rotation axes/shafts 118 and 119 and the elastomers 110, 112 and 114 constitute a linked unit.

Figure 3:
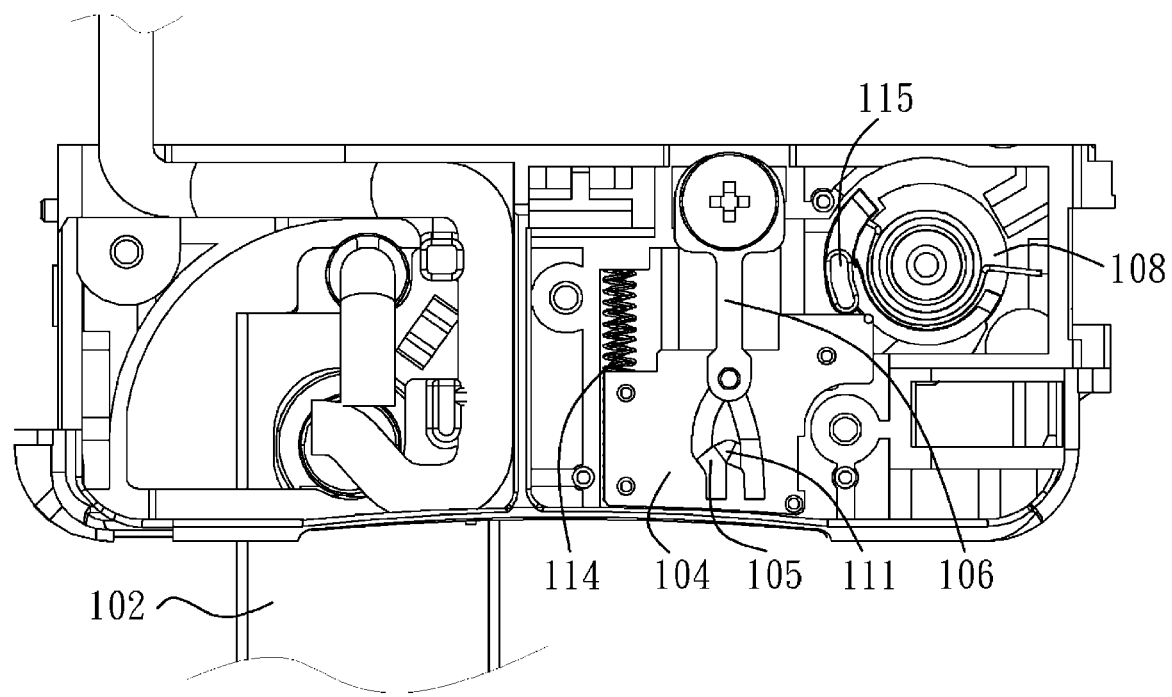
FIG. 3 shows a schematic view of the data connector of a signal transmission module after being expanded out according to one embodiment of the invention.
Figure 4:
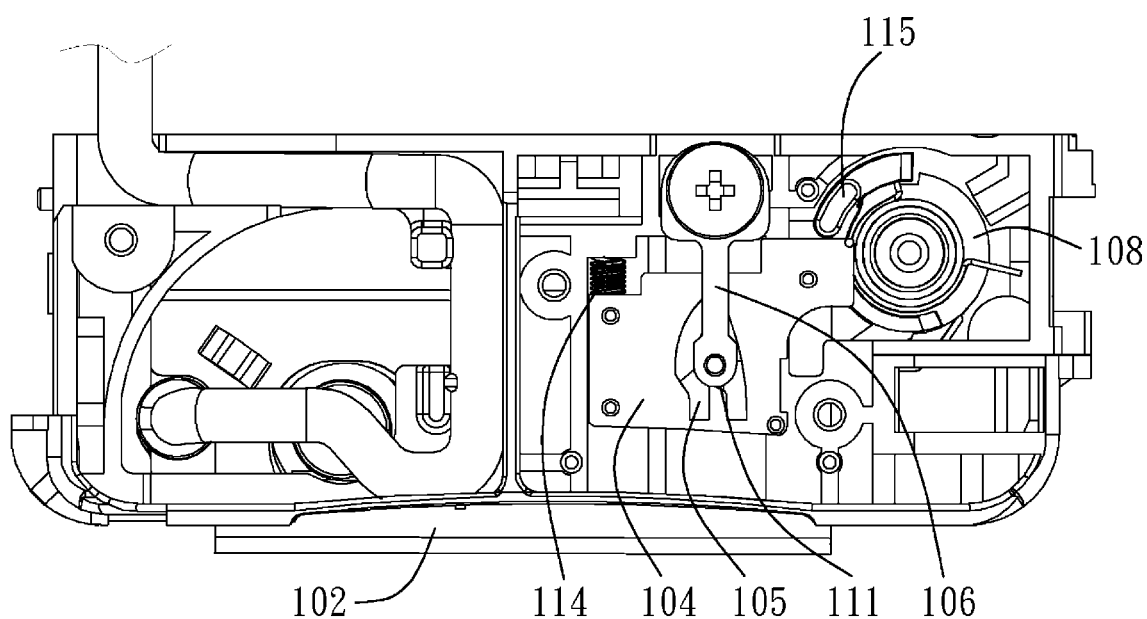
FIG. 4 shows a schematic view of the data connector of a signal transmission module after being retracted back according to one embodiment of the invention.
Figure 5:
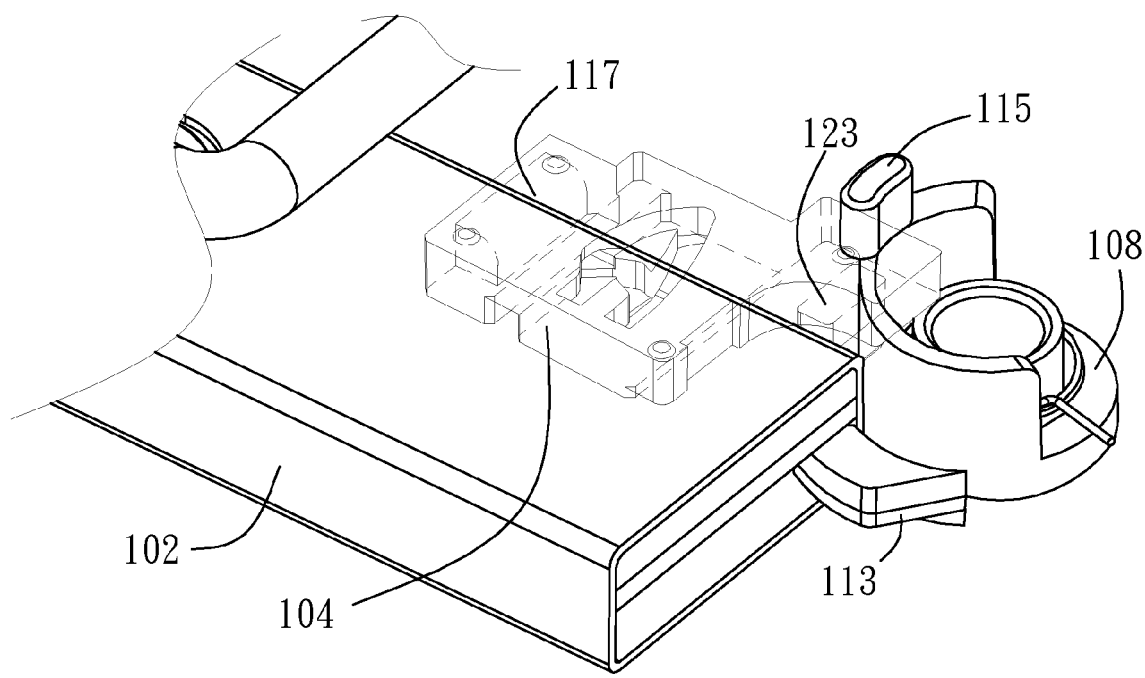
FIG. 5 shows a schematic view of securing and locking the data connector according to one embodiment of the invention.

Furthermore, referring to FIG. 1, FIG. 3, FIG. 4 and FIG. 5 for better understanding, the track on the sliding block and the link according to one embodiment of the invention is shown. The track 105 of the sliding block 104 includes a plurality of incline planes with different tilt angles and height levels and the secure location 111. The first end 107 of the link 106 is assembled on the frame component 103 via the rotation axis/shaft 119 passing through the first end 107 as a pivot, while the second end 109 of the link 106 moves along the track 105 of the sliding block 104 via the cam 124. Referring to FIG. 1 and FIG. 5, the heights of the incline planes of the track 105 gradually decrease along the counterclockwise direction to generate height differences so as to prevent the cam 124 of the link 106 from moving in a reverse direction. The variation direction of the heights of the incline planes of the track 105 set forth is only an example, not a limitation.

Figure 2:
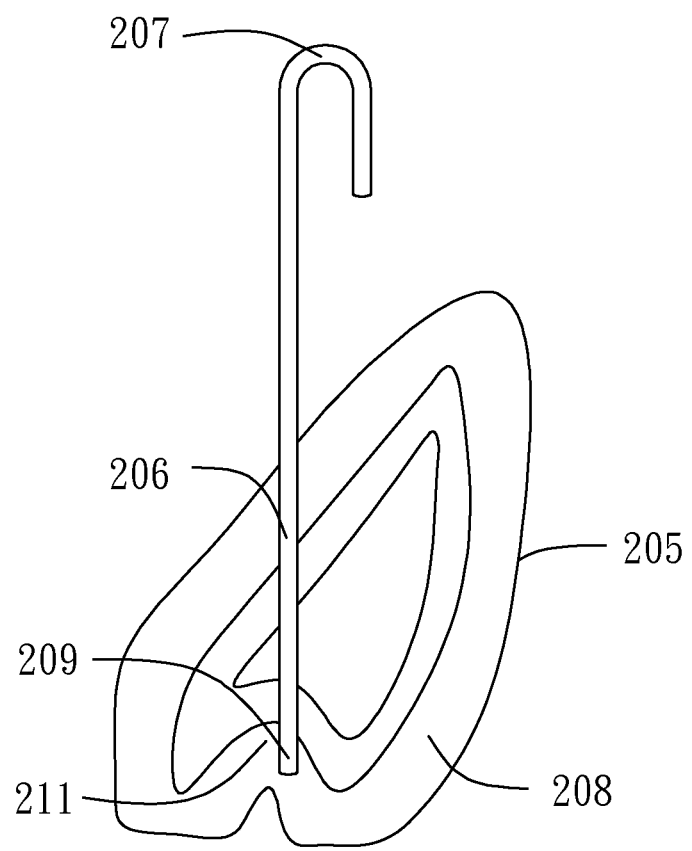
FIG. 2 shows another embodiment of the track on sliding block and the link of the invention.

FIG. 2 shows another embodiment of the track on the sliding block and the link of the invention. Referring to FIG. 1 and FIG. 2, the track 205 includes a plane 208 and a secure location 211. The link 206 has a first end 207 and a second end 209. The first end 207 is disposed on the frame component 103 via a rotation axis/shaft 119 passing through the first end 207 as a pivot. The second end 209 moves along the track 205.

FIG. 3 shows a schematic view of the data connector of a signal transmission module after being expanded out according to one embodiment of the invention. It is noted that although the range of rotation of the data connector 102 in the figure is 90 degree, the range of rotation of the data connector 102 can be, but not limited to 90 to 180 degree. Referring to FIG. 1 and FIG. 3, when a user wants to retract the data connector 102 back to the signal transmission module, through applying a rotational force upon the data connector 102, the data connector 102 rotates according the rotation axis/shaft 121 of the main frame 101 as the pivot and deforms the elastomer 110 along the same direction of rotation. During the retraction of the data connector 102 back to the main frame 101, the data connector 102 directly contacts the barricade 123 of the sliding block 104 and pushes the sliding block 104 toward the first end 107 of the link 106. The sliding block 104 will compress the elastomer 114 and move relatively with the link 106. The cam 124 of the second end 109 of the link 106 then moves from an apex 126 of the track 105 to the secure location 111. The barricade 123 of the sliding block 104 contacts the block piece 115 of the lock block 108 and drives the lock block 108 to rotate. The rotation and expanding direction of the data connector 102 is opposite to that of the lock block 108. When the second end 109 of the link 106 or the cam 124 pass through one side of the track 105 into the secure location 111, the sliding block 104 maintains static since the second end 109 of the link 106 or the cam 124 are secured at the secure location 111. The lock piece 113 of the lock block 108 secures the data connector 102 and completes the retraction of the data connector 102 as shown in FIG. 4.

FIG. 4 shows a schematic view of retracting back the data connector of a signal transmission module according to one embodiment of the invention. Referring to FIG. 1 and FIG. 4, when a user wants to use the data connector 102 to proceed signal transmission or battery recharge, pressing the data connector 102 will further compress the elastomer 114 to move the sliding block 104 toward the rotation axis/shaft 119, and the second end 109 or the cam 124 of the link 106 will escape from the secure location 111. Because of the recovery force of the elastomer 114 pushing the sliding block 104 away from the rotation axis/shaft 119, the second end 109 or the cam 124 of the link 106 will pass through one side of the track 105 to the apex 126 of the track 105. While the sliding block 104 moves away from the rotation axis/shaft 119, since the second end 109 or the cam 124 of the link 106 already escape from the secure location 111, the sliding block 104 will further move back to the original position due to the recovery force of the elastomer 114 during the expanding out of the data connector 102. Since the barricade 123 of the sliding block 104 no longer leans against the block piece 115 of the lock block 108 to prevent the lock block 108 from rotation, the lock block 108 will rotate due to the elastic recovery force of the elastomer 112 so as to remove the lock piece 113 of the lock block 108 from the opening of the data connector 102 and unlock the data connector 102 to expand data connector 102 out.

FIG. 5 shows a schematic view of securing and locking the data connector of a signal transmission module according to one embodiment of the invention. As shown in FIG. 1 and FIG. 5, when the data connector 102 is forced to retract, the data connector 102 rotates and directly contacts the barricade 123 of the sliding block 104. The sliding block 104 moves toward the direction of compressing the elastomer 114 in the slot 117. The barricade 123 of the sliding block 104 pushes the block piece 115 of the lock block 108 and rotates the lock block 108 to render the lock piece 113 of the lock block 108 extending into the opening of the data connector 102. Through pushing the sliding block 104 by the recovery force of the elastomer 114, the cam 124 or the second end 109 of the link 106 leans against the secure location 111 and the lock piece 113 of the lock block 108 can secure the data connector 102, wherein the position of the block piece 115 can be higher, lower or at the same level of the sliding block 104.

Figure 7:
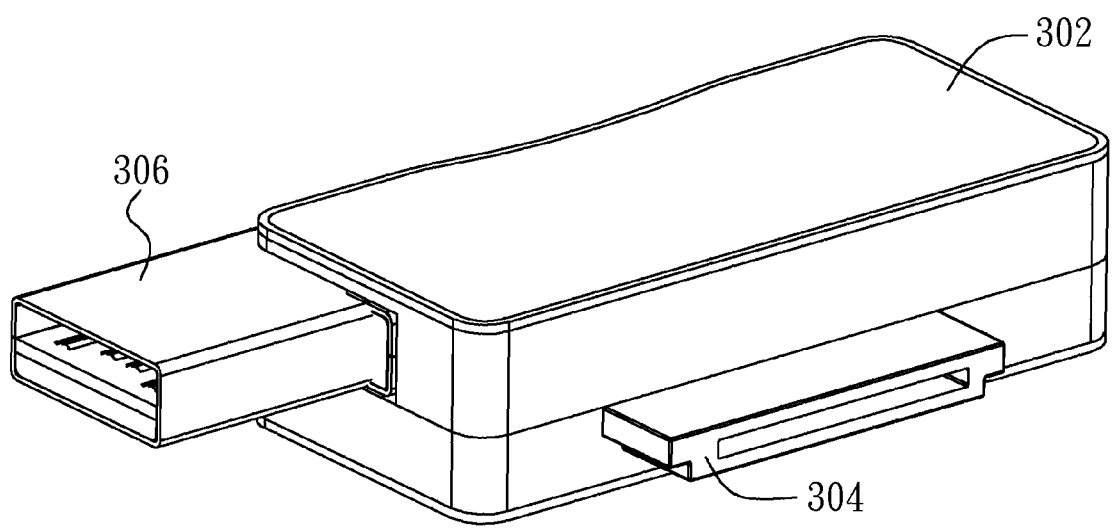

FIG. 6 and FIG. 7 respectively show schematic views of data connectors of signal transmission modules after retracting back and extending out according to one embodiment of the invention. As shown in FIG. 6 and FIG. 7, the electrical connector 304 and the data connector 306 of the signal transmission module are deposed on the module frame 302. The range of rotation of the data connector 306 can be adjusted according to the arrangement of the elastomer 110. As shown in FIG. 6, the range of rotation of the data connector 306 is 180 degree.

Figure 9:
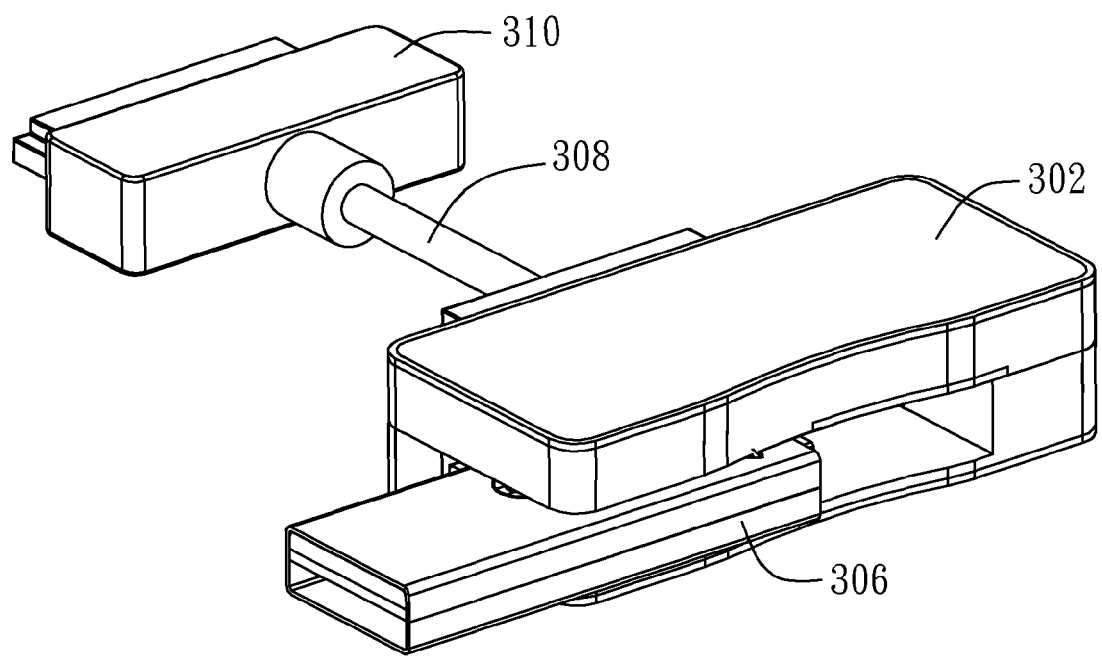

FIG. 8 and FIG. 9 respectively show schematic views of data connectors of signal transmission modules after retracting back and extending out according to another embodiment of the invention. As shown in FIG. 8 and FIG. 9, the electrical connector 310 is deposed outside the module frame 302 and is electrically connected to the module frame 302 and the data connector 306 via a connecting line 308. Since the thicknesses (or heights) of the portable electronic appliance and a computer are not necessarily the same, the electrical connector 310 is extended out through the connecting line 308 so that the portable electronic appliance does not have to suspend while connecting to a computer.

When the connector interface of a portable electronic appliance is not common used interface such as a Universal Serial Bus data connector or an IEEE 1394 data connector, the user can utilize the signal transmission module of the invention as a conversion interface to convert the connector interface to the USB data connector or the IEEE 1394 data connector as the connection interface between the portable electronic appliance and the computer. The signal transmission module of the invention enables the user to extend the data connector out through pressing (push-push) the data connector. The range of rotation of the data connector is not limited to 180 degree as shown in FIGS. 6-9. Through the use of proper elastomer and configuration of the module frame, the range of rotation of the data connector can be adjusted. The electrical connector is not limited to specific electrical connector, and any connector adapted to known portable electronic appliance is included. Moreover, the location where the electrical connector is deposed is not limited.

The signal transmission module of the invention comprises a sliding block, a lock block, a link, an electrical connector, a data connector and a linked unit having a plurality of rotation axes/shafts and elastomers. Through elastically extendable design, the user can directly press to extend the data connector out. If the user wants to retract the data connector, through pressing the data connector, the data connector rotates to push the sliding block and drive the lock block to secure the data connector, while the link is used to secure the sliding block so that the lock block can maintain the status of securing the data connector. The rotations of the data connector and the lock block and the slide of the sliding block are performed through the linked unit. If the user wants to use the data connector, through pressing the data connector again, the link releases the sliding block so that the lock block relieves the status of securing the data connector and the data connector can extend out through the linked unit.

The elastically extendable signal transmission module of the invention can be applied to any portable electronic appliance which needs additional transmission line to connect other electronic system for data transmission or battery recharge. By using the signal transmission module of the invention, the user can proceed data transmission or battery recharge through connecting the portable electronic appliances to other systems such as personal computers or notebook personal computers. Moreover, the elastically extendable signal transmission module of the invention not only can improve the conveniences of carry, data transmission and battery recharge, but also can improve the convenience of operation of the portable electronic appliance through directly pressing the data connector to use or retract the data connector in the signal transmission module. Additional space for extra switch structure can be further saved and the exterior of the portable electronic appliance can be more concise since no separate switch structure is needed.

Although specific embodiments have been illustrated and described, it will be appreciated by those skilled in the art that various modifications may be made without departing from the scope of the present invention, which is intended to be limited solely by the appended claims.

What is claimed is:
1. A signal transmission module, comprising:
an electrical connector;
a linked unit having a plurality of shafts and a plurality of elastomers; and
a data connector, the data connector being rotatable according to the shafts and the elastomers; and
a sliding block wherein the data connector is retracted through pushing of the sliding block.
2. A signal transmission module, comprising:
an electrical connector;
a linked unit having a first shaft, a second shaft, a first elastomer and a second elastomer;
a data connector, the data connector rotating and expanding according to the first shaft and the first elastomer;
a sliding block having a track with a secure location;
a link including a first end and a second end; and
a lock block with a lock piece, the lock block pivoting on the second shaft through the second elastomer;
wherein during retraction of the data connector, the data connector pushes the sliding block to rotate the lock block so that the lock block locks the data connector by the lock piece, and the second end of the link moves to the secure location.
3. The signal transmission module of claim 1, further comprising a lock block with a lock piece wherein the sliding block pushes the lock block to rotate so that the lock piece secures the data connector.

4. The signal transmission module of claim 1, wherein a link includes a first end and a second end, the first end rotating via the shaft of the linked unit, and the second end moving on the sliding block.

5. The signal transmission module of claim 4, wherein the sliding block further comprises a track with a secure location, and the second end of the link moves to the secure location of the track to retract the data connector.

6. The signal transmission module of claim 5, wherein the second end of the link has a cam, and the second end moves on the track via the cam.

7. The signal transmission module of claim 6, wherein the track has a plurality of incline planes with different heights.

8. The signal transmission module of claim 7, wherein the heights of the incline planes gradually decrease along the moving direction of the cam.

9. The signal transmission module of claim 1, wherein the elastomer comprises a torsion spring.

10. The signal transmission module of claim 1, wherein the data connector comprises a Universal Serial Bus (USB) data connector or an IEEE 1394 data connector.

11. The signal transmission module of claim 2, wherein the data connector comprises a Universal Serial Bus (USB) data connector or an IEEE 1394 data connector.

12. The signal transmission module of claim 2, wherein the linked unit further comprises a third shaft and the first end rotates in accordance with the third shaft during retraction of the data connector.

13. The signal transmission module of claim 2, wherein the second end of the link has a cam, and the second end moves on the track via the cam.

14. The signal transmission module of claim 13, wherein the track has a plurality of incline planes with different heights.

15. The signal transmission module of claim 14, wherein the heights of the incline planes gradually decrease along the moving direction of the cam.

16. The signal transmission module of claim 12, wherein the linked unit further comprises a third elastomer and the sliding block moves back to an original position after the expanding of the data connector.

17. The signal transmission module of claim 16, wherein during the expanding out of the data connector, the second end escapes from the secure location and the sliding block moves via the third elastomer so that the data connector escapes from the lock piece.

18. The signal transmission module of claim 2, wherein the electrical connector extends out from the signal transmission module through a connecting line.

19. The signal transmission module of claim 2, wherein the sliding block further comprises a barricade and the data connector pushes the sliding block via the barricade.

* * * * *